US010263186B2

(12) United States Patent
Forrest et al.

(10) Patent No.: US 10,263,186 B2
(45) Date of Patent: Apr. 16, 2019

(54) BULK HETEROJUNCTION ORGANIC PHOTOVOLTAIC CELLS MADE BY GLANCING ANGLE DEPOSITION

(75) Inventors: Stephen R. Forrest, Ann Arbor, MI (US); Ning Li, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 1861 days.

(21) Appl. No.: 12/843,949

(22) Filed: Jul. 27, 2010

(65) Prior Publication Data

US 2011/0020979 A1 Jan. 27, 2011

Related U.S. Application Data

(60) Provisional application No. 61/265,626, filed on Dec. 1, 2009, provisional application No. 61/265,640, filed on Dec. 1, 2009, provisional application No. 61/228,896, filed on Jul. 27, 2009.

(51) Int. Cl.
*H01L 51/00* (2006.01)
*B82Y 10/00* (2011.01)
*H01L 51/42* (2006.01)

(52) U.S. Cl.
CPC ......... *H01L 51/0012* (2013.01); *B82Y 10/00* (2013.01); *H01L 51/424* (2013.01); *H01L 51/4253* (2013.01); *H01L 51/0008* (2013.01); *H01L 51/0046* (2013.01); *H01L 2251/308* (2013.01); *Y02E 10/549* (2013.01)

(58) Field of Classification Search
USPC ................ 438/82, 99; 257/759, 40, E51.019
See application file for complete search history.

(56) References Cited

U.S. PATENT DOCUMENTS

| 4,307,681 | A  | * | 12/1981 | Lampkin et al. ............. 118/666 |
| 6,206,065 | B1 | * | 3/2001  | Robbie et al. ................ 156/349 |
| 6,657,378 | B2 | * | 12/2003 | Forrest et al. ................ 313/503 |
| 6,972,431 | B2 | * | 12/2005 | Forrest et al. .................. 257/40 |
| 7,208,863 | B2 | * | 4/2007  | Strip ............................. 313/112 |
| 7,485,942 | B2 | * | 2/2009  | Ahn et al. ..................... 257/499 |
| 7,638,356 | B2 | * | 12/2009 | Yang ................... H01L 51/0008 257/759 |
| 8,166,649 | B2 | * | 5/2012  | Moore ............................. 29/850 |

(Continued)

FOREIGN PATENT DOCUMENTS

WO WO 2005/101524 10/2005

OTHER PUBLICATIONS

Zhang et al., "Arrays of Crystalline $C_{60}$ and Pentacene Nanocolumns," 90 Applied Physics Letters 193117, 1-3 (May 9, 2007).

(Continued)

*Primary Examiner* — Bradley Smith
*Assistant Examiner* — David J Goodwin
(74) *Attorney, Agent, or Firm* — Finnegan, Henderson, Farabow, Garrett & Dunner, LLP

(57) ABSTRACT

A method of making a bulk heterojunction organic photovoltaic cell by glancing angle deposition. As the disclosed method relies on a trajectory of incident vapor flux that is not parallel to the substrate normal, micro and nano-scale columnar structures of thin films can be grown on the substrate. There is also disclosed a method of forming a donor-acceptor heterojunction by depositing at least one additional organic material over the columnar structures.

22 Claims, 18 Drawing Sheets

(56) References Cited

U.S. PATENT DOCUMENTS

| | | | |
|---|---|---|---|
| 2002/0189542 A1* | 12/2002 | Van Slyke et al. | 118/712 |
| 2005/0067272 A1* | 3/2005 | Pelhos | 204/192.12 |
| 2007/0219375 A1* | 9/2007 | Fujiyama et al. | 546/278.7 |
| 2008/0259976 A1* | 10/2008 | Hrudey et al. | 372/27 |
| 2009/0269587 A1* | 10/2009 | Dressick et al. | 428/411.1 |
| 2010/0006154 A1* | 1/2010 | Kitazawa et al. | 136/263 |
| 2010/0024860 A1* | 2/2010 | He et al. | 136/244 |
| 2010/0147385 A1 | 6/2010 | Kawano et al. | |
| 2010/0301320 A1* | 12/2010 | Rand et al. | 257/40 |

OTHER PUBLICATIONS

Buzea, C. et al. "Thickness and density evaluation for nanostructured thin films by glancing angle deposition," *J. Vac. Sci. Tech. B*, 23(6): 2545-2552 (2005).

Hawkeye, MM et al. "Glancing angle deposition: Fabrication, properties, and applications of micro- and nanostructured thin films," *J. Vac. Sci. Technology A*, 25(5): 1317-1335 (2007).

Jensen, MO et al. "Porosity engineering in glancing angle deposition thin films," *Appl. Phys. A*, 80: 763-768 (2005).

Li, N. et al. "Open circuit voltage enhancement due to reduced dark current in small molecule photovoltaic cells," *Appl. Phys. Lett.*, 94: 023307 (Jan. 2009).

Peumans et al. "Efficient photon harvesting at high optical intensities in ultrathin organic double-heterostructure photovoltaic devices," *Applied Physics Letters*, 76: 2650-2652 (2000).

Robbie et al. "Sculptured thin films and glancing angle deposition: Growth mechanics and applications," *J. Vac. Sci. Technology A*, 15(3): 1460-1465 (1997).

* cited by examiner

ClAlPc/C$_{60}$ devices

| Structure | ClAlPc Thickness | ClAlPc Growth Angle (α) | $J_{sc}$ (mA/cm$^2$) | $V_{oc}$ (V) | Fill Factor | $\eta$ (%) |
|---|---|---|---|---|---|---|
| PHJ | 200 Å | 0° | 4.9 | 0.82 | 0.51 | 2.0±0.1 |
| TBHJ | 200 Å | 40° | 6.2 | 0.62 | 0.52 | 2.0±0.1 |
|  |  | 50° | 6.6 | 0.62 | 0.54 | 2.2±0.1 |
|  |  | 60° | 7.7 | 0.60 | 0.56 | 2.6±0.1 |
| MoOx + TBHJ | 200 Å | 60° | 6.4 | 0.76 | 0.59 | 2.8±0.1 |
| Planar + TBHJ | 150Å / 80Å | 0° / 60° | 8.0 | 0.82 | 0.53 | 3.5±0.1 |
|  | 150Å / 150Å | 0° / 60° | 8.8 | 0.80 | 0.49 | 3.4±0.1 |

CuPc/C$_{60}$ devices

| Structure | CuPc Thickness | CuPc Growth Angle (α) | $J_{sc}$ (mA/cm$^2$) | $V_{oc}$ (V) | Fill Factor | $\eta$ (%) |
|---|---|---|---|---|---|---|
| PHJ | 200 Å | 0° | 6.0 | 0.50 | 0.58 | 1.7±0.1 |
| TBHJ | 160 Å | 60° | 7.4 | 0.38 | 0.64 | 1.8±0.1 |
| Planar + TBHJ | 150Å / 160Å | 0° / 60° | 8.6 | 0.54 | 0.61 | 2.8±0.1 |

FIGURE 12

Tilted Bulk Heterojunction (BHJ) PV Cell

- Pillar size > ClAlPc $L_{ED}$ (<20nm)
  ⇨ Increased interface area leads to increased ClAlPc active region volume than PHJ

- Pillar size < $C_{60}$ $L_{ED}$ (~40nm)
  ⇨ $C_{60}$ active region volume is similar with PHJ ITO / ClAlPc (200Å, α=50°)

ITO / ClAlPc (200Å, α=50°) / $C_{60}$ (400Å)

Nano-pores can be effectively filled by VTE $C_{60}$
⇨ Bulk Heterojunction

BHJ ClAlPc/C$_{60}$ PV Cell Results
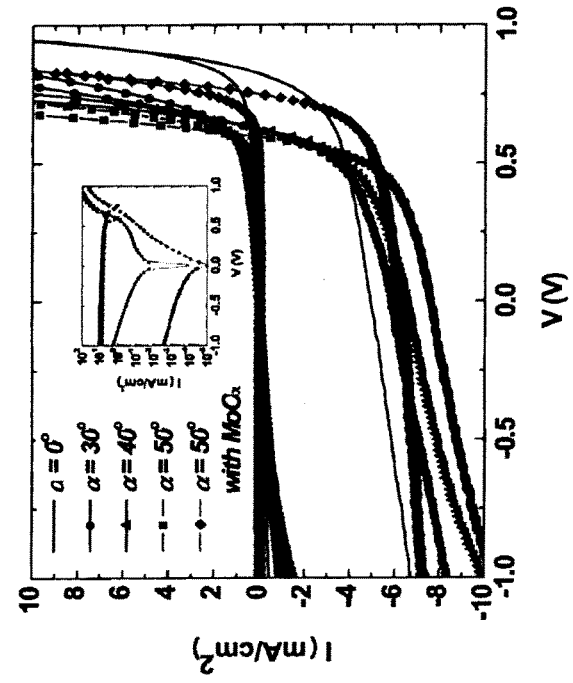
FIG. 17 (a)
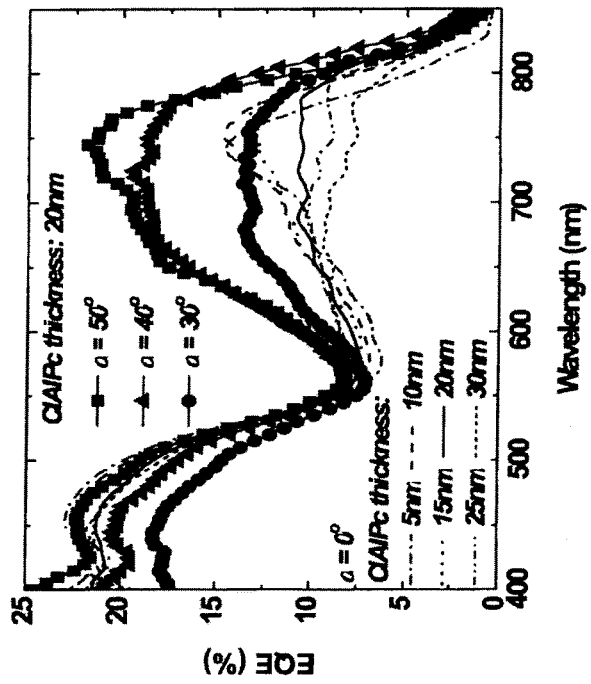
FIG. 17 (b)
| Layer structure | ClAlPc Growth Angle (α) | $J_{sc}$ (mA/cm$^2$) | $V_{oc}$ (V) | Fill Factor | η (%) |
|---|---|---|---|---|---|
| ITO/ ClAlPc(200Å) / C$_{60}$(400Å)/ BCP(100Å)/ Al | 0° | 4.9 | 0.82 | 0.51 | 2.0±0.1 |
| | 50° | 7.7 | 0.60 | 0.56 | 2.6±0.1 |
| ITO/ MoOx(100Å)/ ClAlPc(200Å) / C$_{60}$(400Å)/ BCP(100Å)/ Al | 50° | 6.4 | 0.75 | 0.59 | 2.8±0.1 |
FIGURE 17

CuPc Results
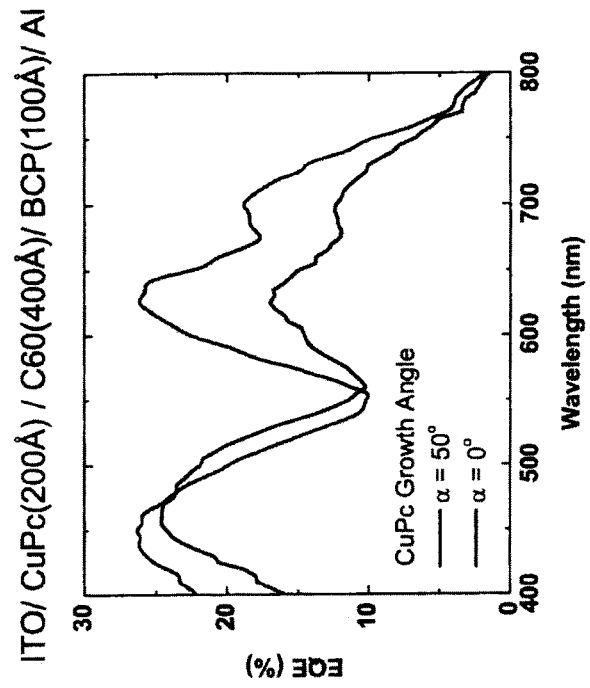
FIG. 18(a)
CuPc thickness: 50nm, $C_{60}$ thickness 40nm
- α-CuPc peak in all films
- Lower intensity for porous films
- CuPc crystal size fitted from FWHM: 25±5nm for α=0°, 20±5nm for α=50°
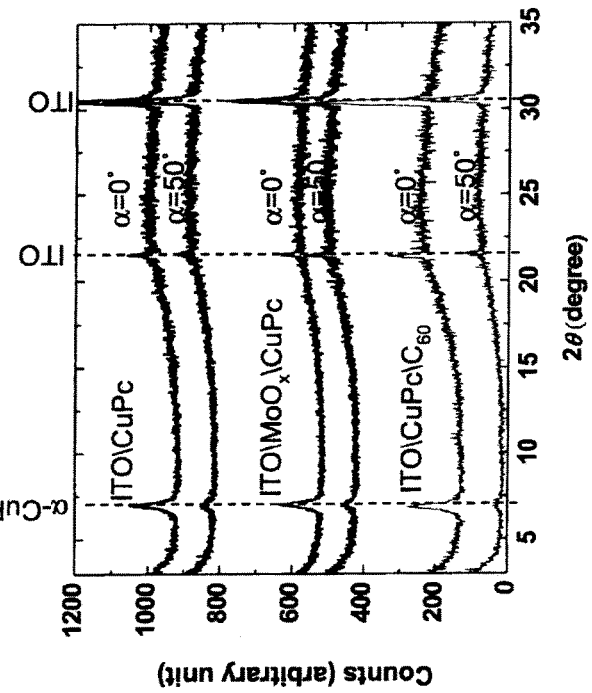
FIG. 18(b)
| CuPc Growth Angle (α) | $J_{sc}$ (mA/cm²) | $V_{oc}$ (V) | FF | η (%) |
|---|---|---|---|---|
| 0° | 4.6 | 0.48 | 0.60 | 1.3±0.1 |
| 50° | 5.7 | 0.46 | 0.65 | 1.7±0.1 |
FIGURE 18

BULK HETEROJUNCTION ORGANIC PHOTOVOLTAIC CELLS MADE BY GLANCING ANGLE DEPOSITION

CROSS-REFERENCE TO RELATED APPLICATION

This application claims benefit of U.S. Provisional Application No. 61/228,896, filed Jul. 27, 2009, U.S. Provisional Application No. 61/265,626, filed Dec. 1, 2009, and U.S. Provisional Application No. 61/265,640, filed Dec. 1, 2009. The contents of all applications are incorporated herein by reference.

STATEMENT REGARDING FEDERALLY SPONSORED RESEARCH

This invention was made with U.S. Government support under Contract No. DE-FG36-08GO18022 awarded by U.S. Department of Energy, National Renewable Energy Laboratory, and Grant No. FA9550-07-01-0364 awarded by Air Force Office of Scientific Research. The government has certain rights in this invention.

JOINT RESEARCH AGREEMENT

The claimed invention was made by, on behalf of, and/or in connection with one or more of the following parties to a joint university-corporation research agreement: University of Michigan and Global Photonic Energy Corporation. The agreement was in effect on and before the date the claimed invention was made, and the claimed invention was made as a result of activities undertaken within the scope of the agreement.

FIELD OF THE DISCLOSURE

The present invention generally relates to methods of making bulk heterojunction organic photovoltaic cells by glancing angle deposition. More specifically, it is directed to growing organic thin films for bulk heterojunctions by oblique angle vacuum deposition (i.e., where the trajectory of the vapor flux is not parallel to the substrate).

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present, and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein, the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes, (2) the photovoltage under open circuit conditions, i.e., the open circuit voltage $V_{OC}$, in Volts, and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff=\{I_{max}V_{max}\}/\{I_{SC}V_{OC}\} \qquad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta=f\!f^*(I_{SC}^*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p-n junction to establish an internal field. Early organic thin film cells, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photo-generation process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low external quantum efficiency (electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A{}^* \eta_{ED}{}^* \eta_{CC}$$

$$\eta_{EXT} = \eta_A{}^* \eta_{INT}$$

The diffusion length ($L_D$) of an exciton is typically much less ($L_D$~50Å) than the optical absorption length (~500Å), requiring a trade-off between using a thick, and therefore resistive, cell with multiple or highly folded interfaces, or a thin cell with a low optical absorption efficiency.

Several methods for making bulk heterojunctions are used including phase separation during spin-coating of polymers, phase segregation from a donor-acceptor mixture induced by high temperature annealing of small-molecular-weight organic layers, and controlled growth of small-molecular-weight organic layers with Organic Vapor Phase Deposition.

Glancing Angle Deposition (GLAD) is known in the art for growing thin films. For example, sculptured thin films have been developed by using glancing angle deposition at an angle (θ>70°), and substrate motion to form columnar thin film microstructures at the nanometer level (Robbie et al., *Sculptured thin films and glancing angle deposition: Growth mechanics and applications*, J. Vac. Sci. Technol. A 15(3): 1460-1465 (1997)). In this case, the vapor flux is rotated about an axis parallel to the substrate surface.

Micro- and nanoscale columnar structures of thin films can also be grown by oblique angle vacuum deposition, wherein the trajectory of the incident vapor flux is not parallel to the substrate normal (Hawkeye, M M. et al., *Glancing angle deposition: Fabrication, properties, and applications of micro-and nanostructured thin films*, J. Vac. Sci. Technol. A 25(5): 1317-1335 (2007)). This induces an atomic-scale shadowing effect ("self-shadowing") during the deposition. Atomic shadowing occurs as the evaporant nucleates in the substrate, and the region behind the nucleus does not receive any further vapor because this region falls in the "shadow" of the nucleus. Therefore, vapor will only be deposited onto the nucleus which leads to the growth of a columnar structure.

The glancing angle deposition technique may incorporate oblique deposition on rotating substrates (Hawkeye, M M. et al.; Jensen, M O et al., *Porosity engineering in glancing angle deposition thin films*, Appl. Phys. A, 80: 763-768 (2005); Buzea, C. et al., *Thickness and density evaluation for nanostructured thin films by glancing angle deposition*, J. Vac. Sci. Tech. B, 23(6): 2545-2552 (2005)). The film's mean density is given by the vapor incidence angle, while the shape of the microstructure can be controlled by substrate rotation. In recent advancement of glancing angle deposition, based on decoupling of the micro-column growth direction from the vapor arrival direction, control over the size and distribution of the columns and pores in the film has been achieved (Jensen, M O et al.).

SUMMARY

There are disclosed methods of making a bulk heterojunction organic photovoltaic cell, that comprises depositing onto a substrate at least one organic material into one or more columnar structures by exposing the substrate to a vapor flux having a trajectory that is not parallel to the substrate normal. In one embodiment, the trajectory may be at an angle α ranging from 30° to 70° to the substrate normal.

Methods disclosed herein may further comprise rotating the substrate about the trajectory of the vapor flux. In one embodiment, the angle α is not fixed, but varies while rotating the substrate about the trajectory of the incident vapor flux. It is appreciated that the donor layer may be deposited without substrate rotation.

In another embodiment, a method further comprises depositing at least one additional organic material to form a donor-acceptor bulk heterojunction. This additional organic layer may be deposited by vacuum thermal evaporation and/or organic vapor phase deposition. The resulting bulk heterojunction organic photovoltaic cell may comprise an anode, a donor layer, an acceptor, an exciton blocking layer, and a cathode.

BRIEF DESCRIPTION OF THE DRAWINGS

The accompanying drawings, which are incorporated in and constitute a part of this specification, illustrate several embodiments of the invention and, together with the description, serve to explain the principles of the invention. The figures are not necessarily drawn to scale.

FIG. 12 illustrates the device performances of the devices from FIG. 8 and FIG. 11.

FIG. 17 illustrates (a) external quantum efficiency for bulk heterojunction photovoltaic cells with oblique angle deposited ClAlPc film comparing various ClAlPc layer thicknesses and deposition angles; and (b) illustrates the linear scale I-V curves for the bulk heterojunction devices comparing various deposition angles, and with an MoOx anode interfacial layer.

FIG. 18 illustrates (a) X-ray diffraction results for various CuPc samples; and (b) illustrates external quantum efficiency for bulk heterojunction photovoltaic cells with oblique angle deposited ITO/CuPc films for deposition angles of 0° and 50°.

DETAILED DESCRIPTION OF THE INVENTION

Definitions

As used herein, the term "organic" includes polymeric materials as well as small molecule organic materials that may be used to fabricate organic optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes, but is not limited to, metal complexes of hydrocarbyl and heteroatom-substituted hydrocarbyl ligands.

Methods and processes are described herein for using glancing angle deposition, and specifically oblique angle deposition, to make bulk heterojunction organic photovoltaic cells. The glancing angle deposition technique is capable of making a uniform, ("chessboard") structure. Further, this technique may increase exciton collection efficiency, and ensure good charge collection efficiency by maintaining charge conductive pathways to all parts of the junction. Bulk heterojunction organic photovoltaic cells may have increased exciton diffusion efficiency as compared to, for example, planar heterojunction organic photovoltaic cells made by conventional deposition techniques.

Figure 4:
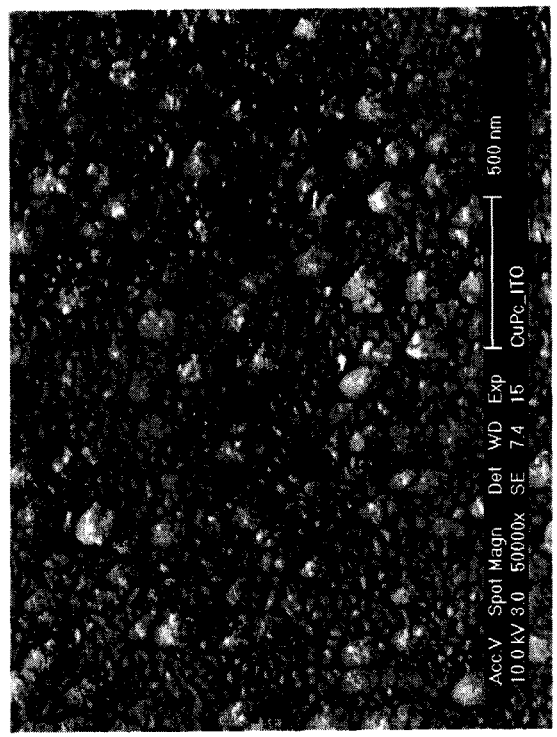
FIG. 4(a) is an SEM image of oblique angle deposited 1500 Å $Alq_3$ film.
FIG. 4(b) is an SEM image of oblique angle deposited 270 Å CuPc film.
Figure 4:
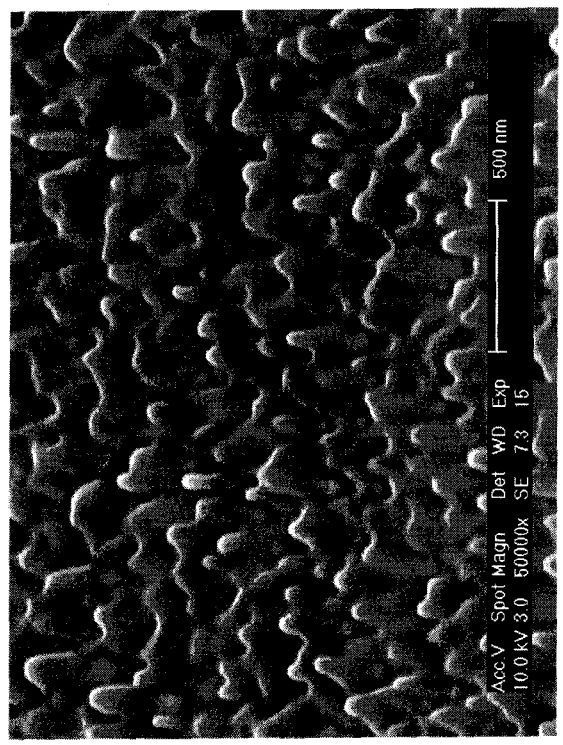

Glancing angle deposition is compatible with organic films grown with vacuum thermal deposition. For example, scanning electron microscope (SEM) images of a 1500 Å $Alq_3$ film and a 270 Å CuPc film deposited on an indium tin oxide substrate at oblique angles are seen in FIG. 4. FIG. 4(a) shows a surface structure with a thick Alq3 film, with columns on the scale of 100 nanometers. For the thin CuPc film shown in FIG. 4(b), columns start to form in some areas, but the scale of the surface structure is much smaller. Growth conditions, such as deposition angle, deposition rate, substrate rotation, and substrate temperature, may alter surface morphology of the film layers.

As stated, the method may also comprise depositing at least one additional organic material to form a donor-acceptor heterojunction. This additional organic layer may be deposited by, for example, vacuum thermal evaporation and/or organic vapor phase deposition. The resulting bulk heterojunction organic photovoltaic cell may comprise an anode, a donor layer, an acceptor, an exciton blocking layer, and a cathode.

Electrodes, such as anodes and cathodes, may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity. Metal substitutes include, for example, doped wide-bandgap semiconductors, degenerate semiconductors, conducting oxides, and conductive polymers.

The term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner. It will be noted that as the terms are used herein, anodes and cathodes may be electrodes or charge transfer layers.

Electrodes may comprise a single layer or multiple layers (a "compound" electrode), and may be transparent, semi-transparent, or opaque. Examples of electrodes and electrode materials include, but are not limited to, those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

In one embodiment, the anode may comprise an interfacial layer comprising molybdenum oxide (MoOx).

Non-limiting examples of the donor layer that may be used herein include subphthalocyanine (SubPc), copper pthalocyanine (CuPc), chloroaluminium phthalocyanine (ClAlPc), tin phthalocyanine (SnPc), pentacene, tetracene, diindenoperylene (DIP), and squaraine (SQ). It is appreciated that the donor layer may optionally be deposited without substrate rotation.

In another embodiment, the acceptor may be deposited with substrate rotation. Non-limiting examples of the acceptor materials that may be used herein include $C_{60}$, $C_{70}$, 3,4,9,10-perylenetetracarboxylicbis-benzimidazole (PTCBI), and hexadecafluorophthalocyanine (F16CuPc).

In another embodiment, the exciton blocking layers may be deposited with substrate rotation. Examples of exciton blocking layers (EBLs) are described in U.S. Pat. Nos. 6,451,415 and 7,230,269 to Forrest et al., which are incorporated herein by reference for their disclosures related to EBLs. Additional background explanation of EBLs may also be found in Peumans et al., "Efficient photon harvesting at high optical intensities in ultrathin organic double-heterostructure photovoltaic diodes," Applied Physics Letters 76, 2650-52 (2000), which is also incorporated herein by reference. EBLs reduce quenching by preventing excitons from migrating out of the donor and/or acceptor materials. Non-limiting examples of the exciton blocking layer that may be used herein include bathocuproine (BCP), bathophenanthroline (BPhen), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium(III) (RuAcaca3), and aluminum(III)phenolate ($Alq_2OPH$).

Examples of the cathode that may be used herein include a metal substitute, a non-metallic material or a metallic material chosen from Ag, Au, and Al.

It is appreciated that the substrate may comprise a conducting oxide, such as one chosen from indium tin oxide (ITO), tin oxide (TO), gallium indium tin oxide (GITO), zinc oxide (ZO), and zinc indium tin oxide (ZITO), and the transparent conductive polymers comprises polyanaline (PANI). In one embodiment, the bulk heterojunction organic photovoltaic cell comprises:

ITO/CuPc/$C_{60}$/BCP/Al; and
ITO/ClAlPc/$C_{60}$/BCP/Al.

The organic layers described herein may have thicknesses ranging from 25-1200 Å, such as 50-950 Å, or even 50-300 Å.

In one embodiment, a bulk heterojunction may be made by covering the film with another organic material to form a top layer to fill in the gaps between the nano-pillars of the bottom film. The top organic material may be deposited, for example, by vacuum thermal evaporation (VTE), spin coating, or organic vapor phase deposition (OVPD). OVPD is different from vacuum thermal evaporation (VTE) in that OVPD uses a carrier gas to transport vapors into a deposition chamber. Spatially separating the functions of evaporation and transport leads to precise control over the deposition process, and enabling control over the organic surface morphology, e.g., flat with smooth surface or layers with protrusions. Another feature of OVPD, compared with VTE, is the large molecular surface diffusivity and the non-ballistic trajectories followed by the molecules in their arrival at the surface. OVPD is particularly effective at filling preexisting voids and other surface non-uniformities, whereas VTE is ineffective due to the long mean free paths and ballistic trajectories followed by incident molecules.

To make better bulk heterojunction PV cells, the film morphology of glancing angle deposited organic layers may be optimized by changing the growth conditions. Higher deposition angle may result in lower nanopillar density because of increased shadowing effect. Lower deposition rate and higher substrate temperature tend to give larger nano-pillar diameter, due to more significant molecule diffusion on the substrate. Substrate rotation may change the pillar size and growth direction as well.

Another factor affecting the device performance is the top layer covering the glancing angle deposited film. It may be desirable for the top layer to completely fill in the gaps between the nano-pillars of the bottom glancing angle deposited film. For example, vacuum thermal evaporation may be used to fill the gaps. Other methods, for example, spin coating and organic vapor phase deposition, may result in better coverage.

Figure 1:
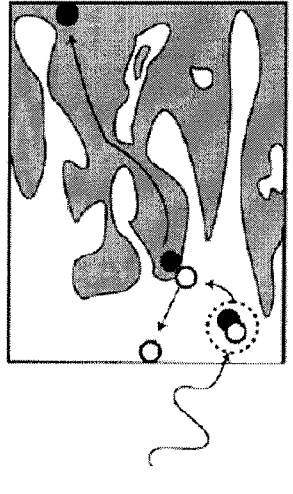
FIG. 1 illustrates exciton dissociation associated with typical organic donor-acceptor heterojunctions for (a) a planar heterojunction and (b) a bulk heterojunction.
Figure 1:
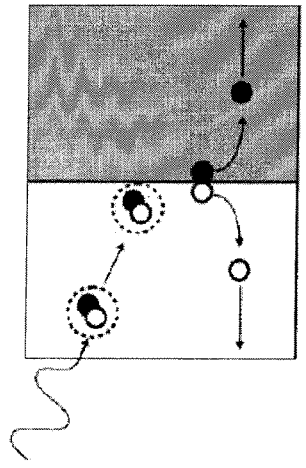
Figure 2:
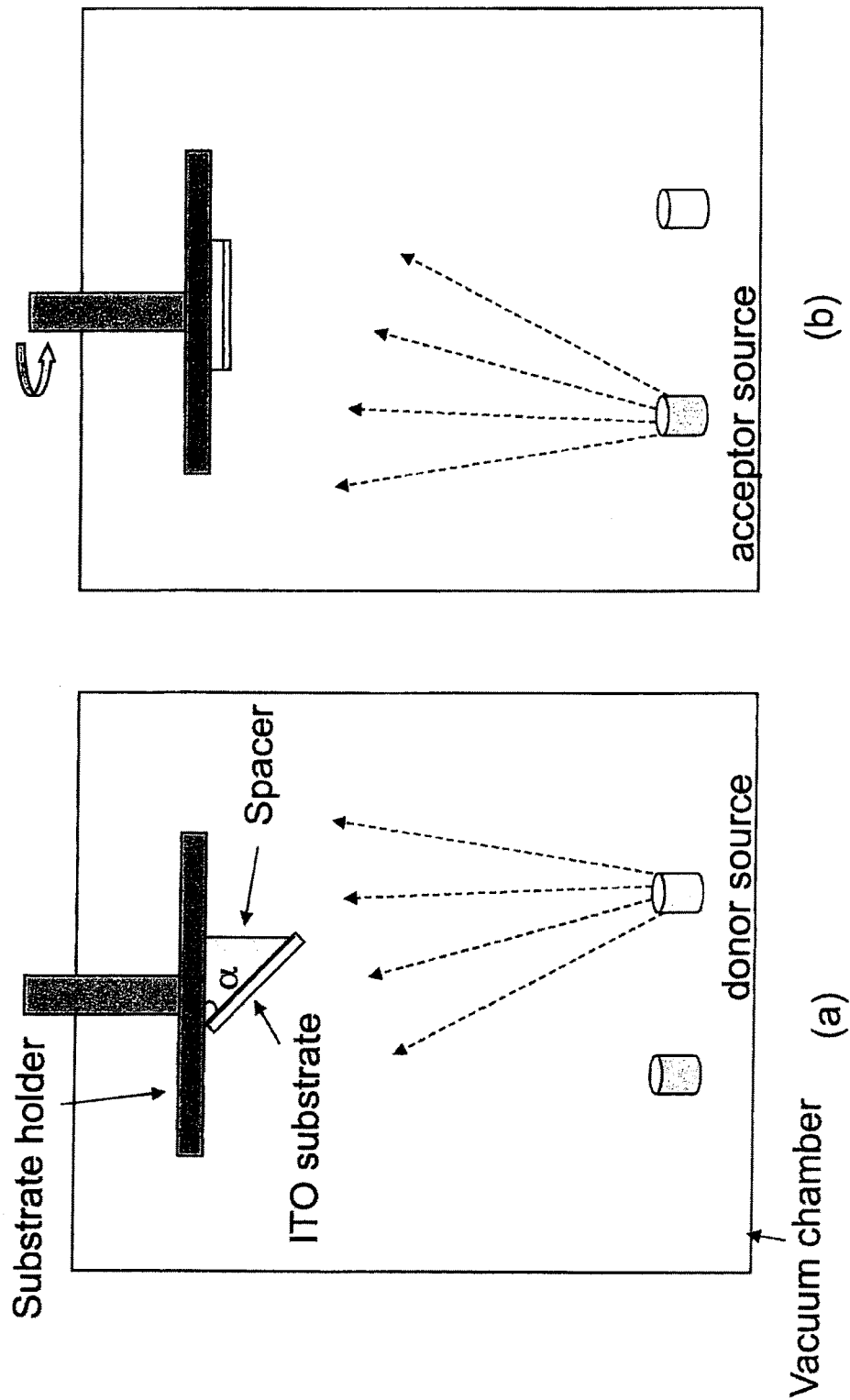
FIG. 2 illustrates the growth chamber used for the oblique angle deposition of the donor material (a), and the normal deposition of the acceptor material (b) in the process of growing a bulk heterojunction photovoltaic cell.

FIG. 2 illustrates an exemplary growth chamber used for oblique angle deposition. The growth chamber may, in one embodiment, have one substrate holder, multiple evaporation sources, and several triangular spacers made from rubber with different angles ($\alpha$), such as, 0°, 40°, 50°, 60°, and 70°. The growth rates may be different for deposition with different angle spacers, and may be calibrated using silicon substrates and Ellipsometry measurement. When using the calibrated deposition rate, donor material may be evaporated onto the ITO substrate without the substrate rotation. The spacer may be removed after donor growth. The acceptor material $C_{60}$ and BCP exciton blocking layer may then be evaporated with the substrate attached to the substrate holder directly. Substrate rotation may be used in the $C_{60}$ and BCP depositions.

Prior to being loaded in a thermal evaporation chamber with a base pressure of less than $1\times10^{-6}$ Torr, all organic materials may be purified by thermal gradient sublimation. The substrate, for example, indium tin oxide (ITO) coated glass substrates with a sheet resistance of 20 Ω/sq, may be solvent cleaned and ultraviolet ozone treated. The device structure grown by thermal evaporation comprises an ITO anode, a donor layer with varied thickness and deposition angle, an acceptor, for example, a 400 Å thick film of $C_{60}$ acceptor, an exciton blocking layer, for example, a 100 Å thick film of bathocuproine (BCP), and a cathode, for example Al. A vacuum break to an inert nitrogen environment may be present between growth of the donor and accepter in order to change the deposition angle; and between the growth of the exciton blocking layer and the cathode to attach a shadow mask consisting of an array of 1 mm diameter openings. The cells may be tested in air using a semiconductor parameter analyzer and illuminated with an AM1.5G solar simulator using a 150 W xenon arc lamp. Neutral density filters may be used to vary the intensity of the incident light.

Figure 3B:
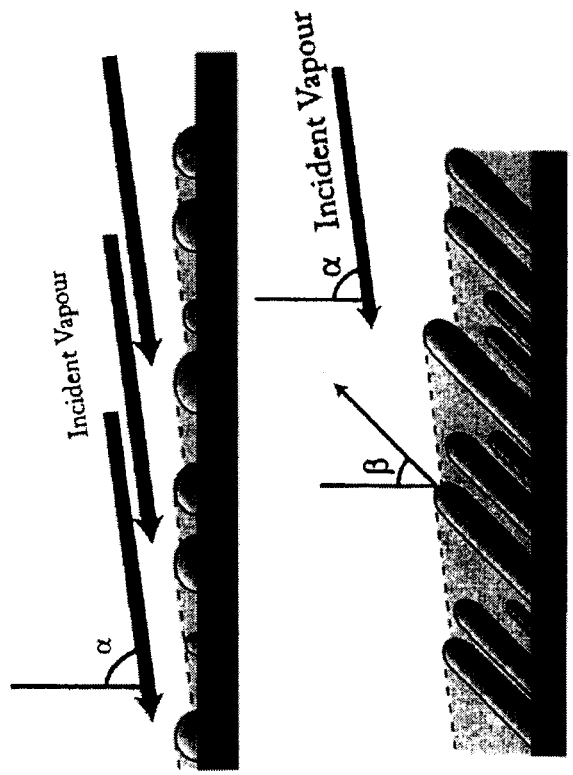
FIG. 3 illustrates (a) the Oblique Angle Deposition of Organic Materials according to an embodiment of the present invention; and (b) representation of growth surfaces made with oblique angle deposition of the incident vapor.
Figure 3A:
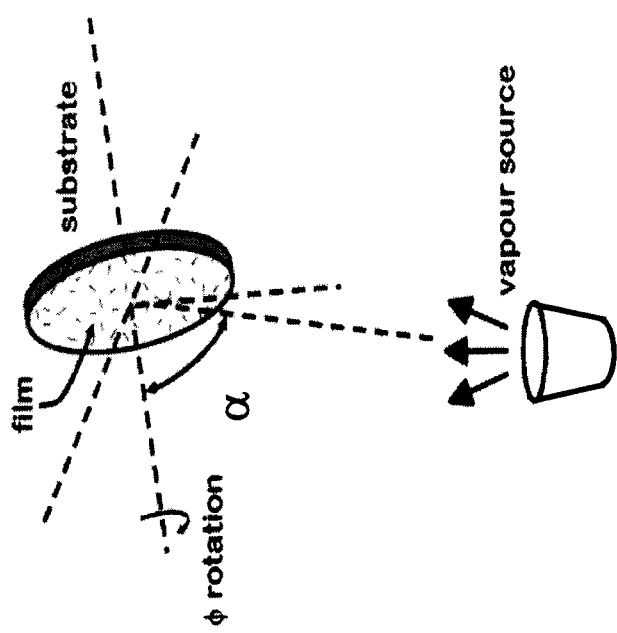

FIG. 3 demonstrates the formation of nano-columns due to the molecular shade shadowing, and FIGS. 4(a) and 4(b) are SEM images of a 1500 Å Tris(8-hydroxyquinolinato) aluminium ($Alq_3$) film and a 270 Å copper phthalocyanine (CuPc) film deposited on ITO substrates at oblique angles respectively. A surface structure with columns on the scale of one hundred nanometers is observed for the thick $Alq_3$ film. For the thin CuPc film, big columns start to form in some areas, but in other areas, the scale of the surface structure is much smaller.

Figure 5:
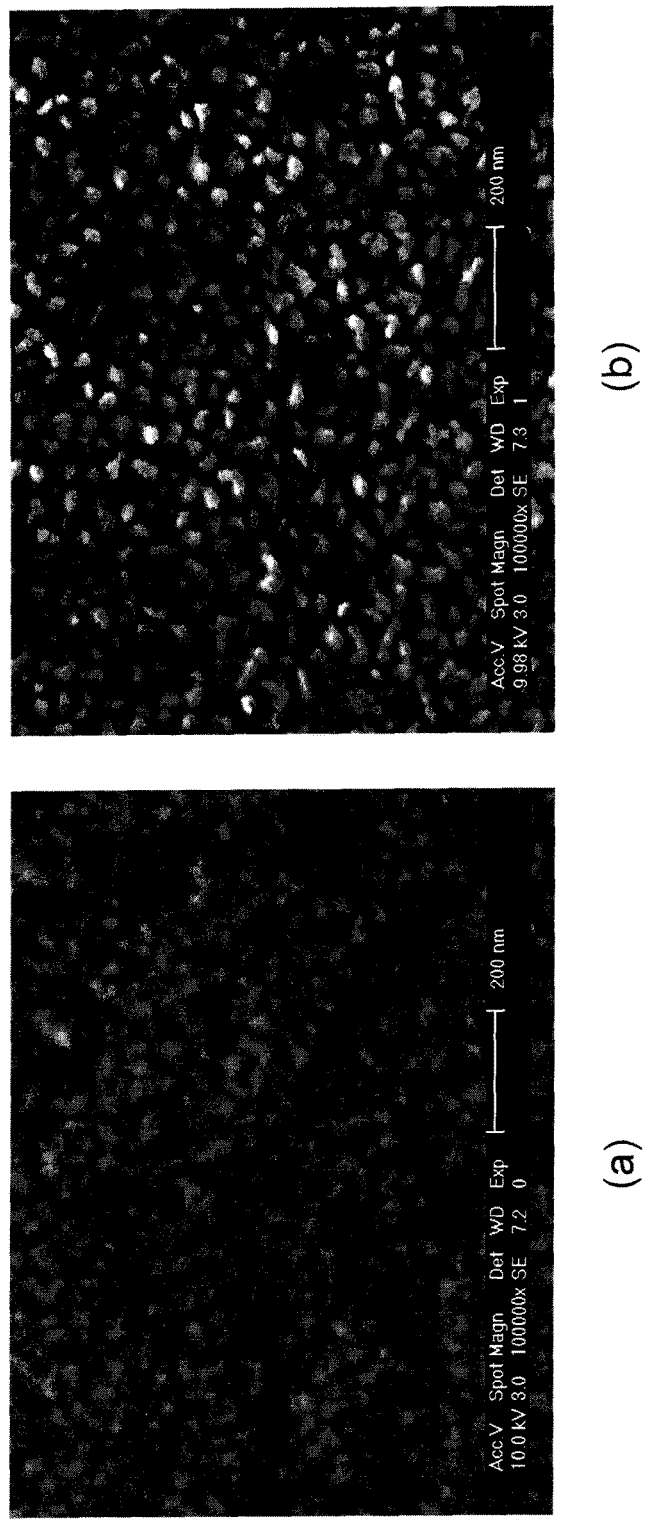
FIG. 5(a) is an SEM image of a 200 Å thick ClAlPc film conventionally deposited.
FIG. 5(b) is an SEM image of a 200 Å thick ClAlPc film obliquely deposited with a 50° spacer on indium tin oxide substrates.

Similar surface morphology is observed for chloralminum phthalocyanine (ClAlPc) thin films deposited on ITO substrates. FIG. 5 compares the SEM images of 200 Å thick ClAlPc normally deposited (FIG. 5(a)) and the same thickness ClAlPc films obliquely deposited with a 50° spacer (FIG. 5(b)) on ITO substrates. The normally deposited one shows a continuous film without voids. The surface of obliquely deposited ClAlPc film shows columns and pores with sizes of ~30 nm, which is close to the exiton diffusion length of most organic materials.

Figure 6:
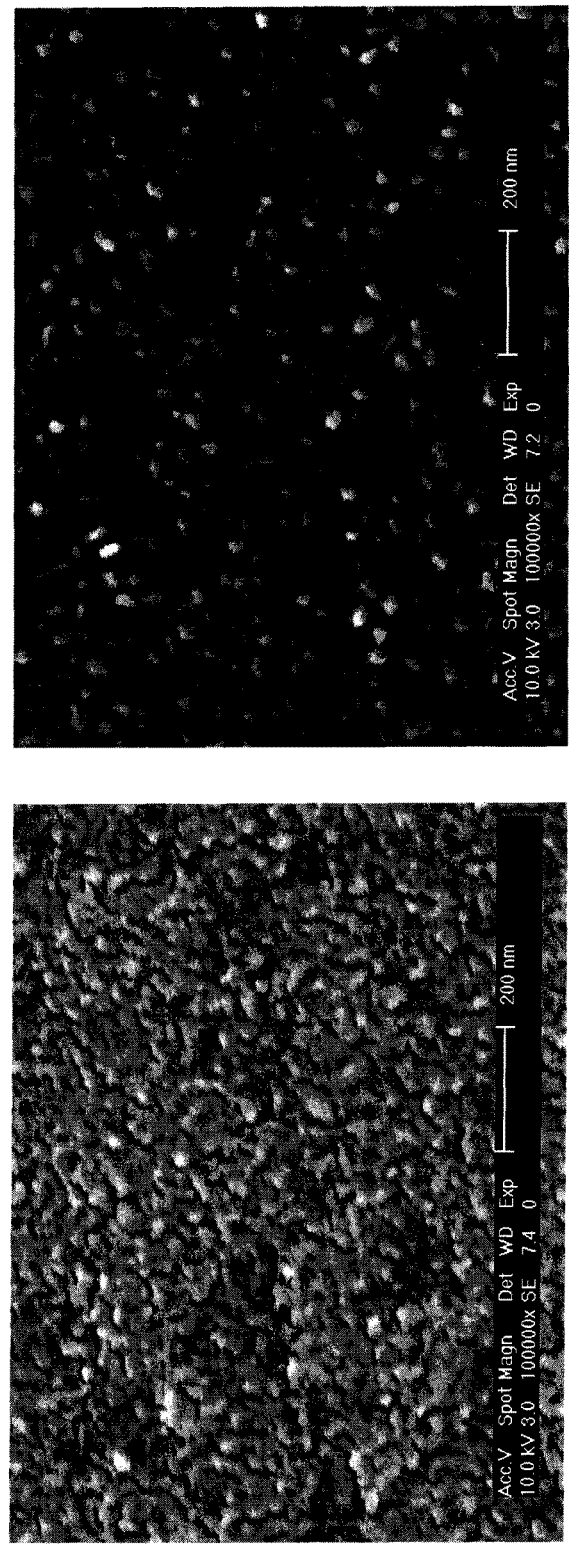
FIGS. 6(a) and 6(b) are SEM images of ClAlPc obliquely deposited film on MoOx.

MoOx is an exemplary anode interfacial layer in organic PV cells, which serve to reduce dark current and increase open circuit voltage (Li, N. et al., *Open circuit voltage enhancement due to reduced dark current in small molecule photovoltaic cells*, Appl. Phys. Lett., 94, 023307, January 2009). The surface morphology of glancing angle deposited ClAlPc film on MoOx is also examined, as shown in FIG. 6. The glancing angle deposited ClAlPc film (6b) is full of voids with a size of ~30 nm on the surface, while the normally evaporated ClAlPc film (6a) shows only tiny gaps. From these SEM images, the dimensions of the surface structures of glancing angle deposited films are suitable for organic bulk heterojunction PV cell applications.

EXAMPLES

Specific examples of the invention are illustrated and/or described herein. However, it will be appreciated that modifications and variations of the invention are covered by the above teachings and within the purview of the claims without departing from the spirit and scope of the invention.

Example 1

Figure 7:
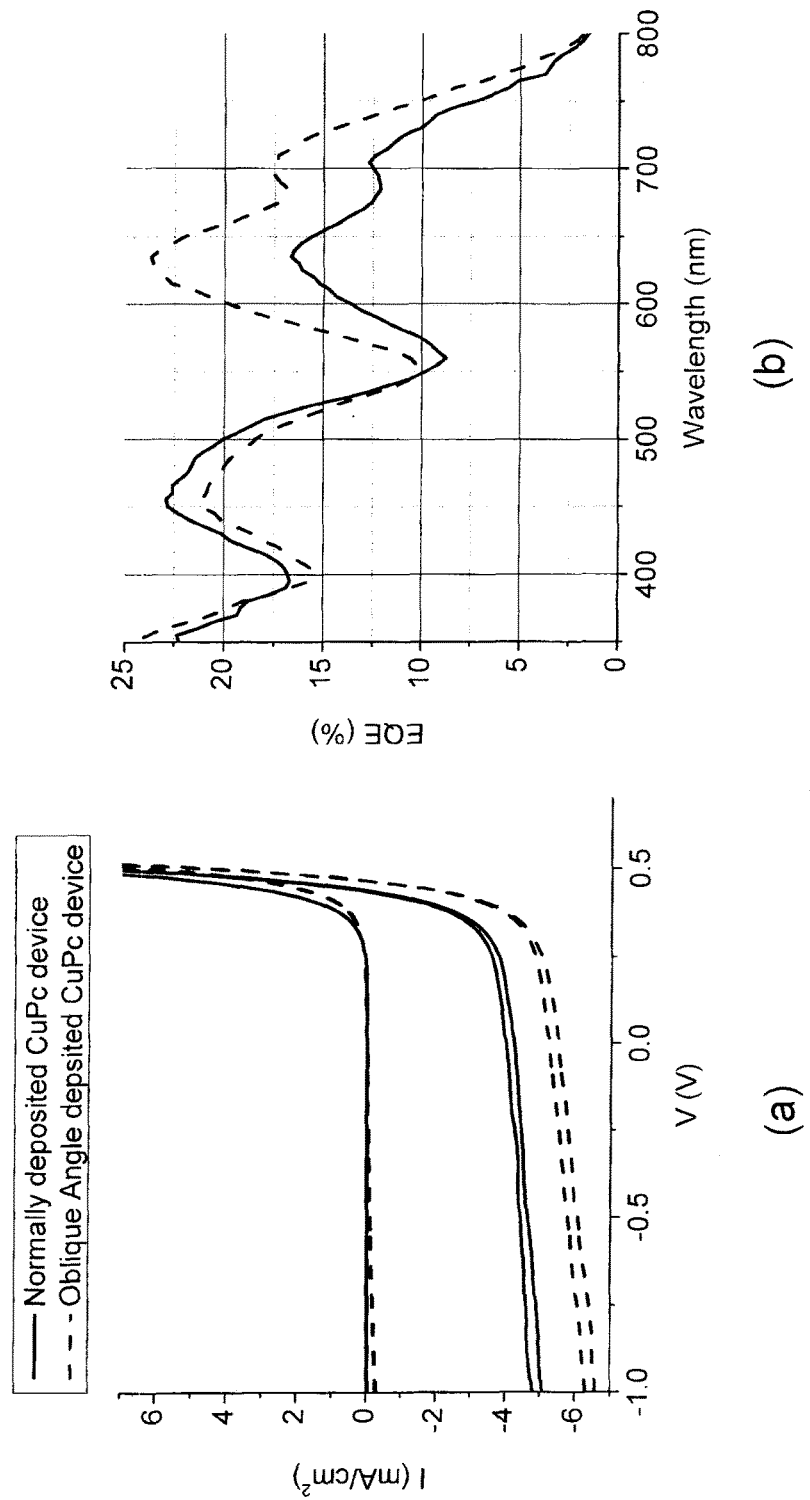
FIG. 7(a) illustrates differences in photocurrent between bulk heterojunction photovoltaic cells with oblique angle deposited CuPc film, and planar heterojunction photovoltaic cells conventionally deposited with CuPc film.
FIG. 7(b) illustrates differences in higher external quantum efficiency from 550 nm to 800 nm, where CuPc absorbs, between bulk heterojunction photovoltaic cells with oblique angle deposited CuPc film, and planar heterojunction photovoltaic cells conventionally deposited with CuPc film.

Bulk heterojunction ITO/CuPc (200 Å)/$C_{60}$ (400 Å)/BCP (100 Å)/Al (1000 Å) photovoltaic cells were made with the process described above. A planar heterojunction (PHJ) device with conventionally deposited CuPc layer was also made for comparison. The results are shown in FIG. 7. The CuPc device grown by glancing angle deposition shows higher photocurrent (FIG. 7(a)) and higher external quantum efficiency (EQE) in the region of 550 nm to 800 nm (FIG. 7(b)), where CuPc absorbs. This may be attributed to the increased exciton diffusion efficiency in the CuPc layer of the bulk heterojunction device. The similarity of the EQE in the region of 350 nm to 550 nm where $C_{60}$ absorbs may be attributed to the large exciton diffusion length in the $C_{60}$ layer, where the exciton diffusion efficiency change induced by interface morphology is negligible.

Example 2

Figure 8:
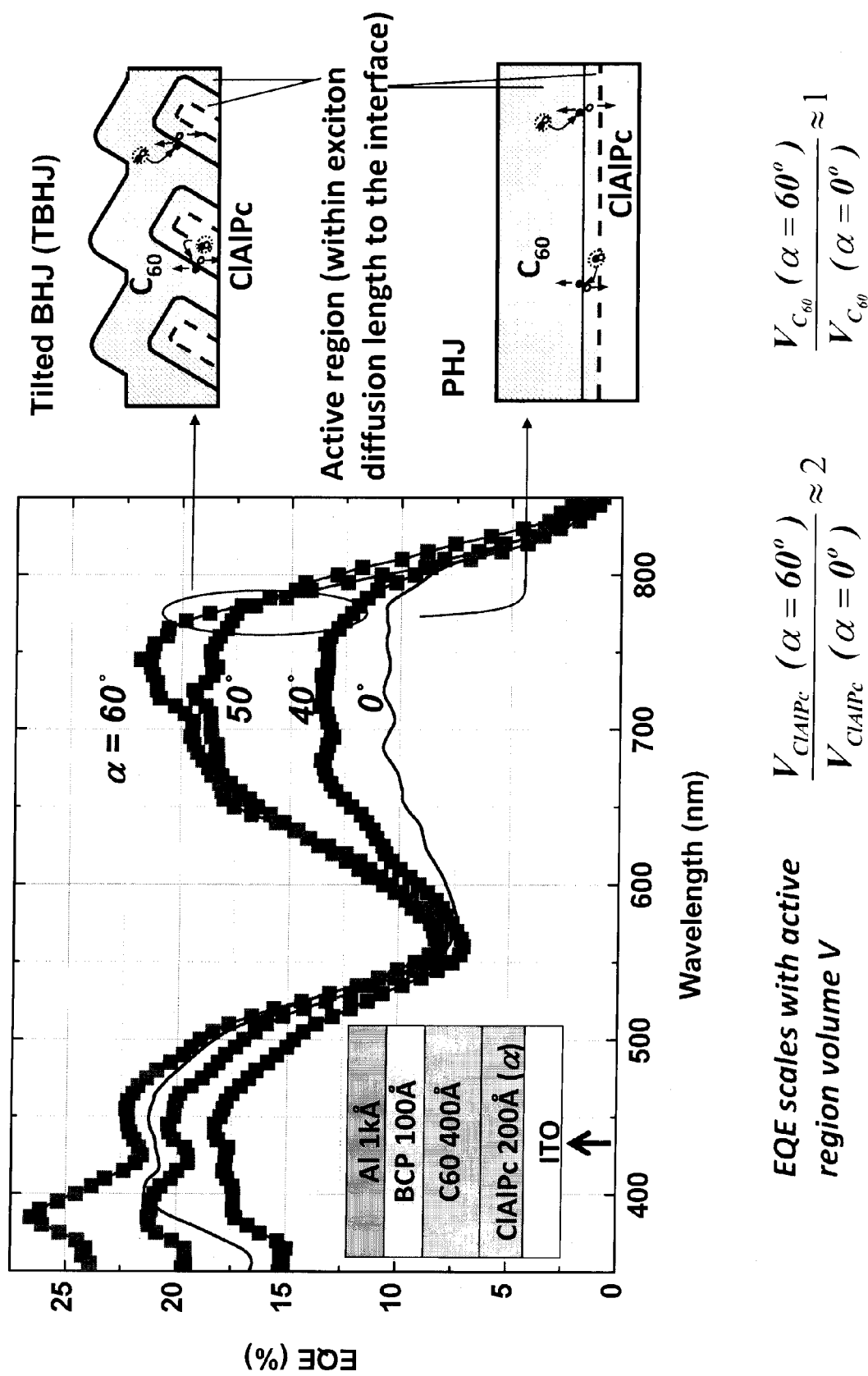
FIG. 8 illustrates differences in higher external quantum efficiency between bulk heterojunction photovoltaic cells with oblique angle deposited ClAlPc film and planar heterojunction photovoltaic cells with conventionally deposited ClAlPc film, comparing various deposition angles.

Bulk heterojunction ITO/ClAlPc/$C_{60}$ (400 Å)/BCP (100 Å)/Al (1000 Å) PV cells were also made with the process described above. Glancing angle deposited bulk heterojunction PV cells were compared with the PHJ cells with various ClAlPc thicknesses. As demonstrated in FIG. 8, with the increase of the deposition angle the device EQE increased. When the deposition angles were 40° and 50°, the EQE from 600 nm to 800 nm was higher than the PHJ cell. This suggests that the glancing angle deposited bulk heterojunction PV cells may have higher EQE than PHJ PV cells made with the same material.

Figure 9:
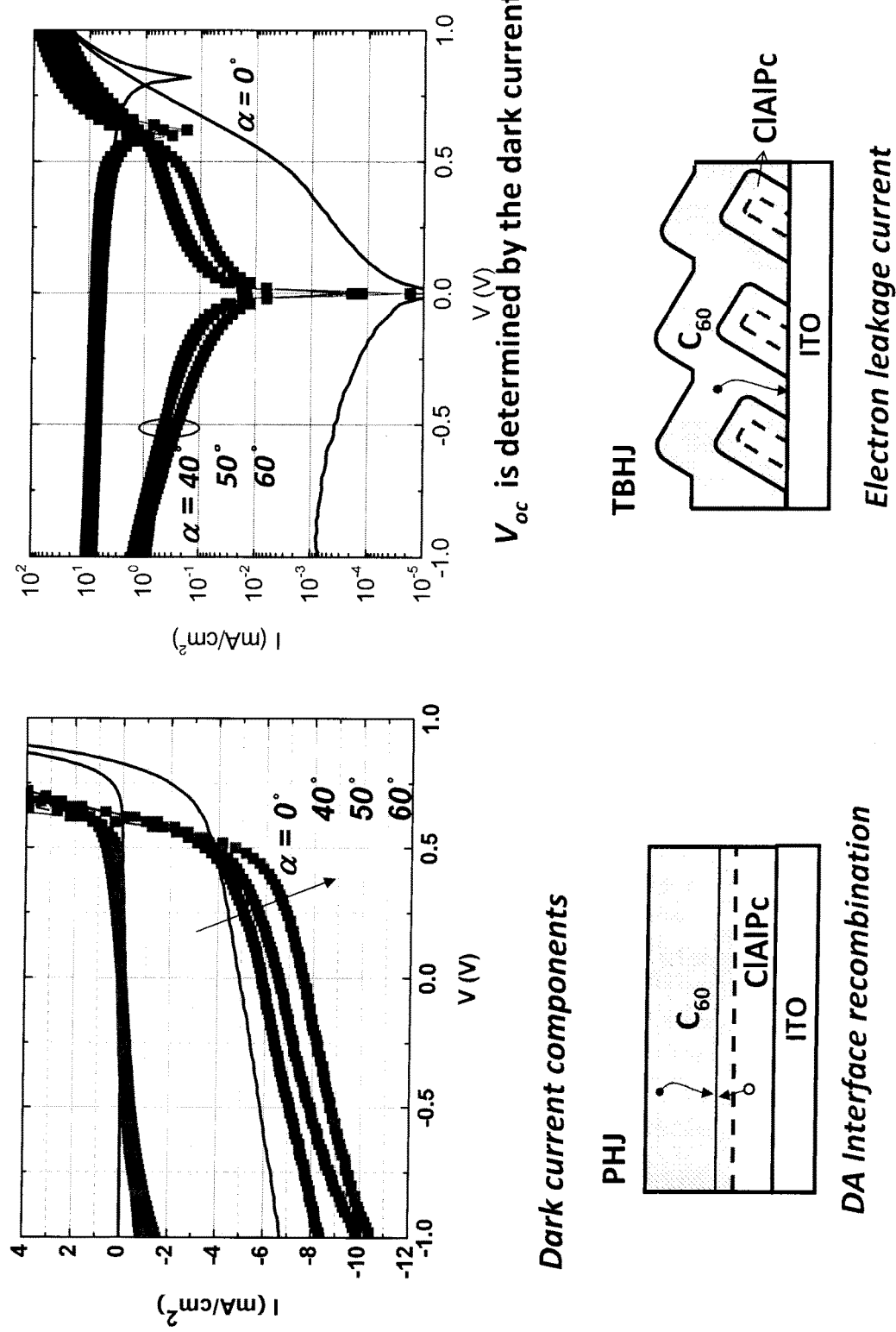
FIG. 9 illustrates the linear scale I-V curves comparing various deposition angles for the bulk heterojunction devices and planar heterojunction device in FIG. 8.
Figure 10:
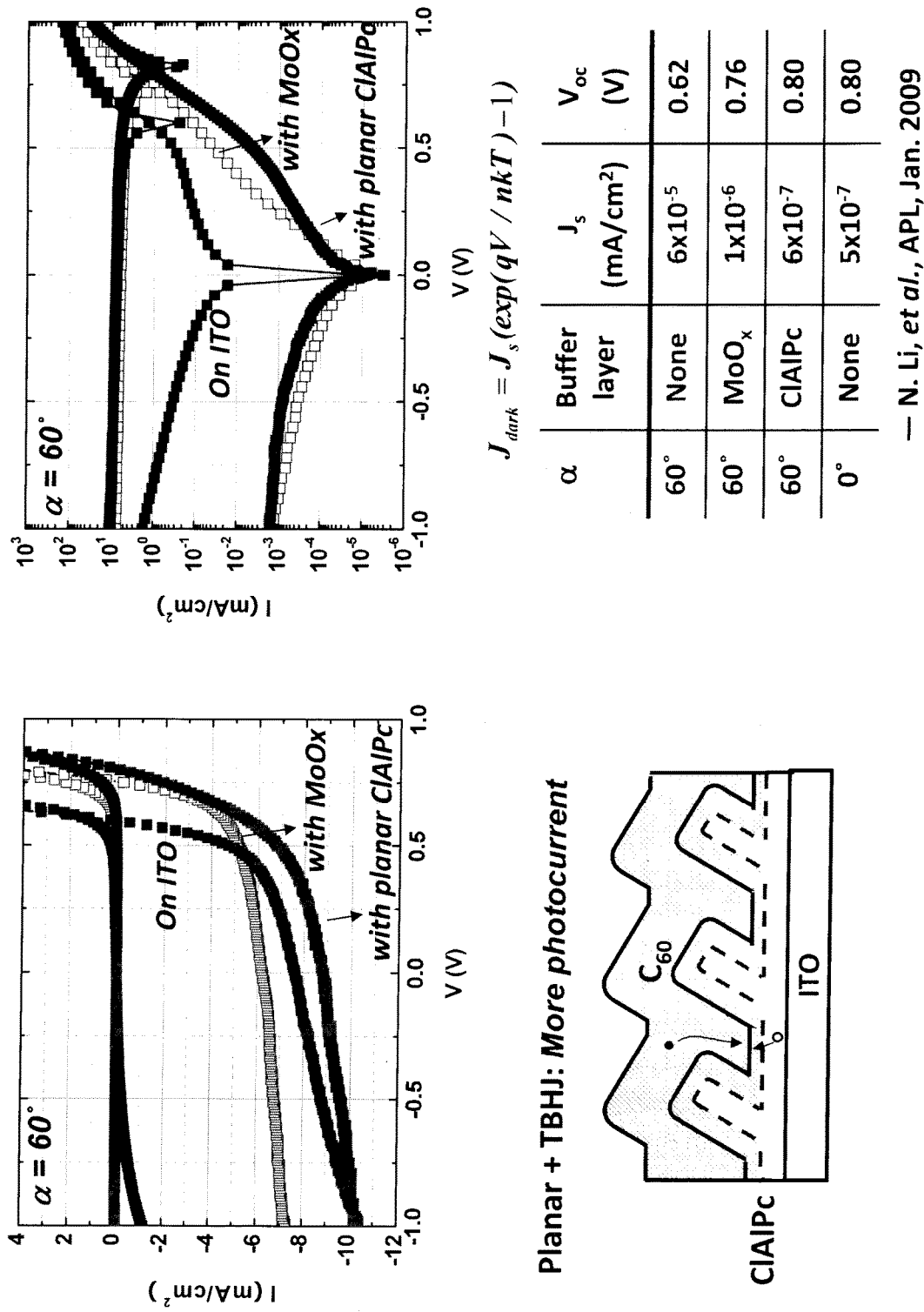
FIG. 10 illustrates the I-V curves for the bulk heterojunction device with and without an additional MoOx layer and the planar heterojunction device of FIG. 8.

FIG. 9 illustrates the current-voltage (I-V) curves of the above ClAlPc/$C_{60}$ PV cells at dark and one sun. Short circuit current ($J_{SC}$) was higher for glancing angle deposited bulk heterojunction cells, and increased with the deposition angle up to 60°. However, open circuit voltage ($V_{OC}$) was lower for glancing angle deposited bulk heterojunction cells, due to increased dark current, which was a result of porous film. A 100 Å MoOx interfacial layer may be incorporated to block the dark current and increase $V_{OC}$ (Li, N. et al.), as shown in FIG. 10. The device performances are summarized in the tables at FIG. 12. In addition, Table 1, below, provides a summary of ClAlPc/$C_{60}$ device performance at one sun, AM 1.5 illumination

TABLE 1

ClAlPc/$C_{60}$ device performance at one sun, AM 1.5 illumination

| | Jsc (mA/cm2) | Voc (V) | FF | η ( % ) |
|---|---|---|---|---|
| α = 0° | 5.0 | 0.82 | 0.51 | 2.1 |
| α = 30° | 6.2 | 0.62 | 0.52 | 2.0 |
| α = 40° | 6.6 | 0.62 | 0.54 | 2.2 |
| α = 50° | 7.7 | 0.60 | 0.56 | 2.6 |
| α = 50° with MoOx | 6.4 | 0.75 | 0.59 | 2.8 |

Figure 11:
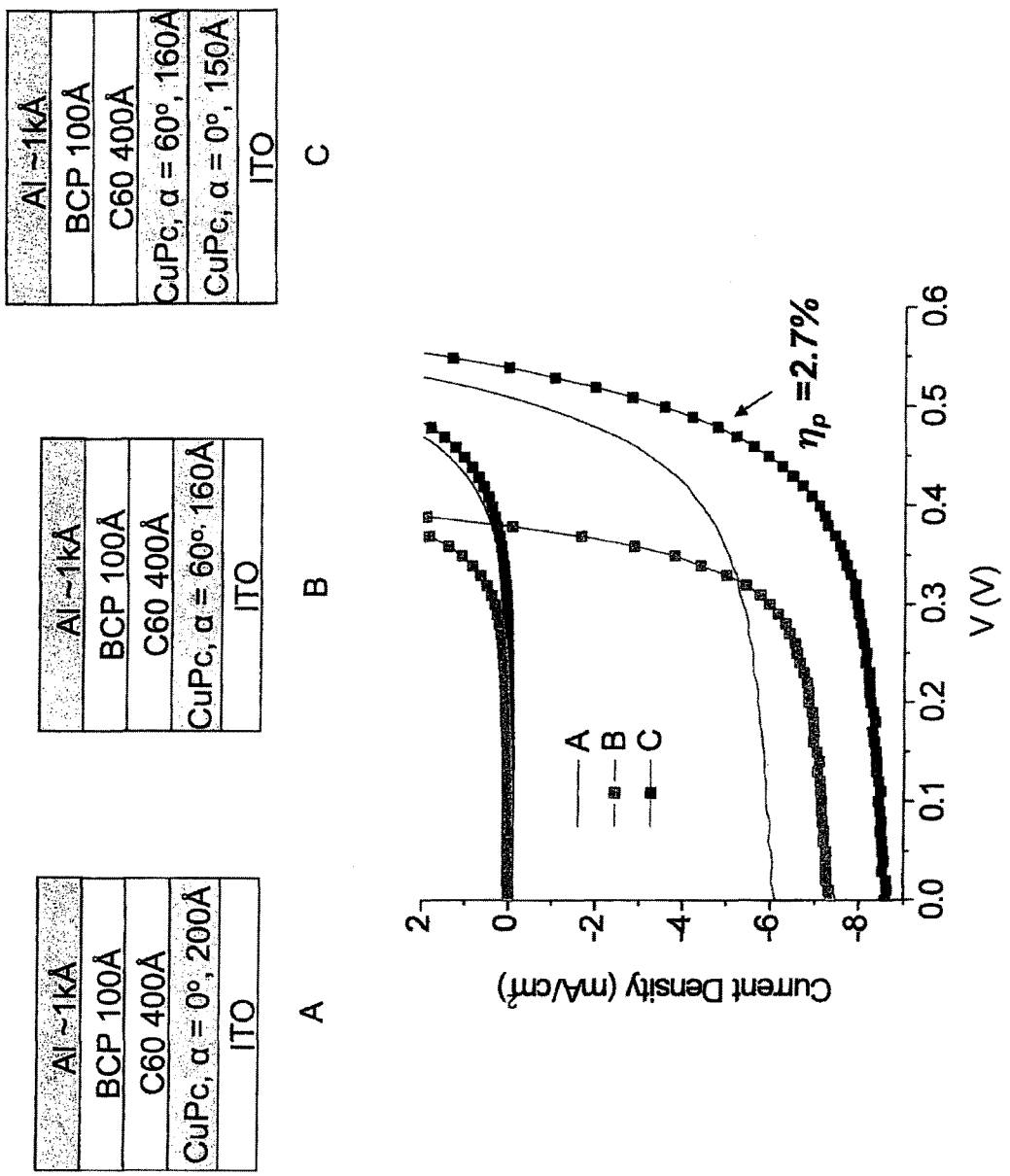
FIG. 11 illustrates the difference between CuPc/C60 PV cell performance with and without a thin conformal buffer layer of donor material.
Figure 13:
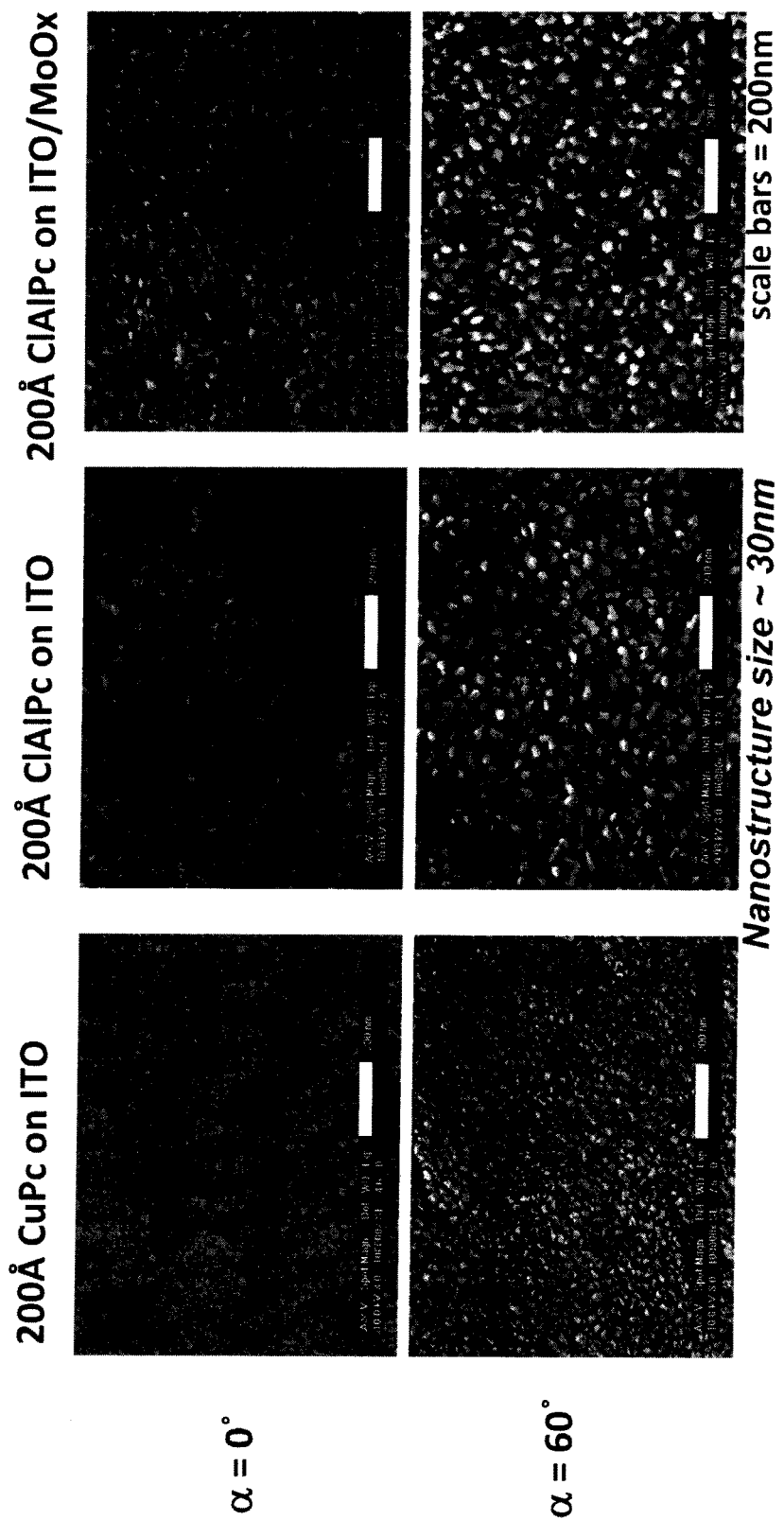
FIG. 13 compares SEM images of obliquely (60°) and conventionally (0°) deposited CuPc and ClAlPc films on ITO and on ITO/MoOx.
Figure 14:
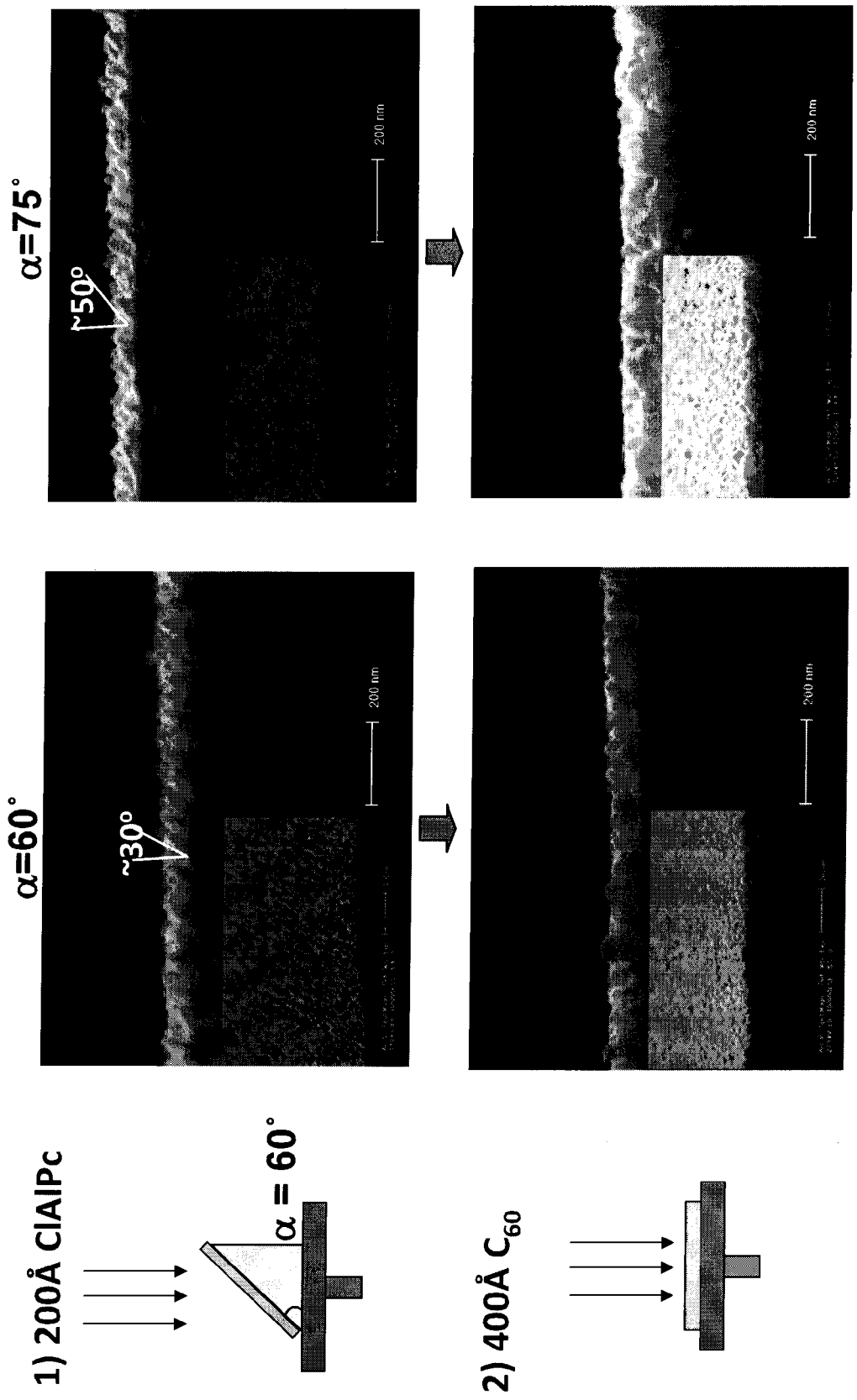
FIG. 14 illustrates bulk heterojunction devices with oblique angle deposited ClAlPc film at two angles (60° and 75°) followed by deposition of $C_{60}$ by thermal evaporation.

To reduce the dark current and provide more interfacial junction area, a thin conformal buffer layer of donor material can be deposited normally first onto the ITO substrate before the oblique angle deposition. FIG. 11 compares the CuPc/C60 PV cell performance with and without this thin conformal buffer layer. The experiment includes a CuPc/C60 planar heterojunction device (A), an oblique angle deposited BHJ device (B), and an oblique angle deposited BHJ device with a planar buffer layer (C). As demonstrated in FIG. 11, device C has the highest $J_{SC}$ and the best power conversion efficiency of 2.7% among all devices. Further, device (C) has a higher $V_{OC}$ due to lower dark current in comparison with device (B), and has a slightly higher $V_{OC}$ than the planar heterojunction device (A), because $V_{OC}$ increases with photocurrent when dark current difference is negligible.

Figure 15:
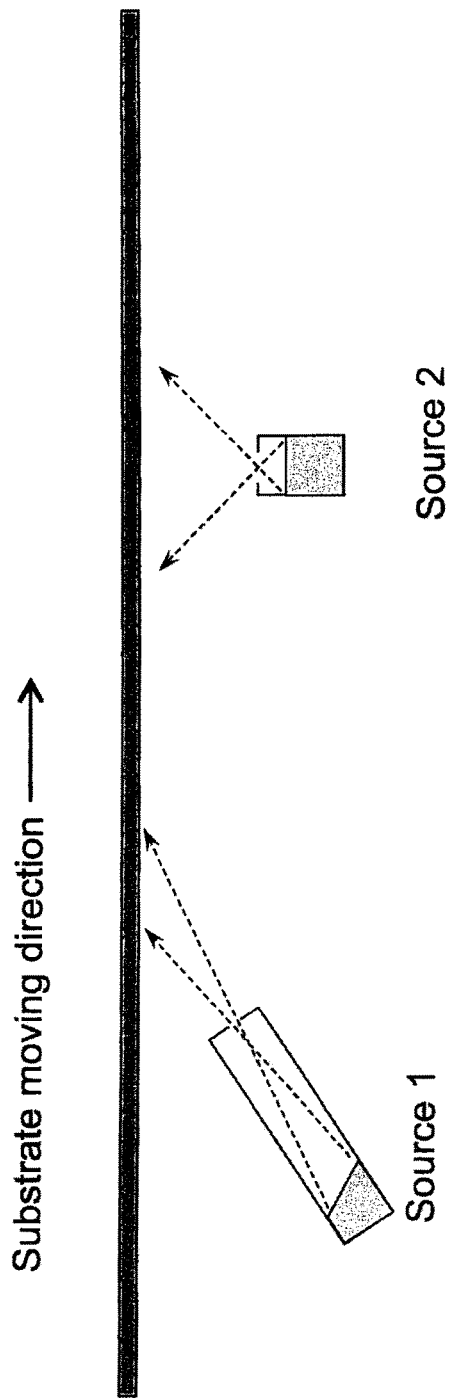
FIG. 15 illustrates a schematic of an in-line deposition method for high throughput manufacturing of PV cells.
Figure 16:
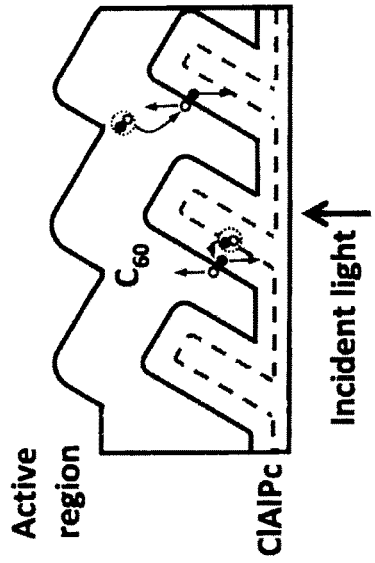
FIG. 16 illustrates Tilted Bulk Heterojunction PV Cell according to the present invention and SEMS of materials made thereby.
Figure 16:
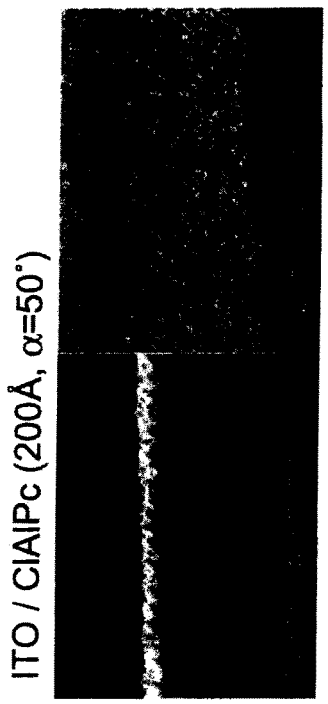
Figure 16:
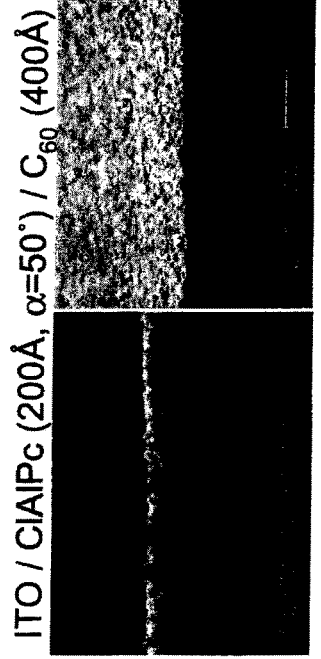

High throughput manufacturing of the PV cell structures described herein may be possible using in-line deposition method as shown in FIG. 15. As illustrated in FIG. 15, a large area substrate moves from left to the right. Source 1 is tilted at an angle α for oblique angle deposition of the first layer. Source 2 provides normal deposition of the second layer to cover nano-structures formed during the source 1 deposition. While the substrate is moving from left to right, bulk heterojunctions may be formed at a high throughput continuously on a large area substrate. This process is also compatible with roll-to-roll processing.

The specification and examples disclosed herein are intended to be considered as exemplary only, with a true scope and spirit of the invention being indicated in the claims.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

As used herein the terms "the," "a," or "an" mean "at least one," and should not be limited to "only one" unless explicitly indicated to the contrary. Thus, for example, "a layer" should be construed to mean "at least one layer."

What is claimed is:

1. A method of making an organic photovoltaic cell, said method comprising depositing onto a substrate at least one organic material to form at least one bulk heterojunction comprising one or more columnar structures of organic films by exposing said substrate to an incident vapor flux having a trajectory that is at an angle (α) ranging from 30° to 70° to the substrate normal.

2. The method of claim 1, further comprising rotating the substrate about the trajectory of said incident vapor flux.

3. The method of claim 1, said method further comprising rotating the substrate about the trajectory of the incident vapor flux, wherein the angle α varies during said rotating.

4. The method of claim 1, further comprising depositing at least one additional organic material on said columnar structures to form a donor-acceptor heterojunction.

5. The method of claim 4, wherein the bulk heterojunction organic photovoltaic cell comprises an anode, a donor layer, an acceptor, an exciton blocking layer, and a cathode.

6. The method of claim 5, wherein the donor layer is deposited without substrate rotation.

7. The method of claim 6, wherein the donor layer is chosen from subphthalocyanine (SubPc), copper pthalocyanine (CuPc), chloroaluminium phthalocyanine (ClAlPc), tin phthalocyanine (SnPc), pentacene, tetracene, diindenoperylene (DIP), and squaraine (SQ).

8. The method of claim 5, wherein the acceptor and exciton blocking layer are deposited with substrate rotation.

9. The method of claim 5, wherein the acceptor is chosen from $C_{60}$, $C_{70}$, 3,4,9,10-perylenetetracarboxylicbis-benzimidazole (PTCBI), and hexadecafluorophthalocyanine (Fl6CuPc).

10. The method of claim 5, wherein the exciton blocking layer is chosen from bathocuproine (BCP), bathophenanthroline (BPhen), 3,4,9,10-perylenetetracarboxylicbis-benzimidazole (PTCBI), 1,3,5-tris(N-phenylbenzimidazol-2-yl) benzene (TPBi), tris(acetylacetonato) ruthenium(III) (RuAcaca3), and aluminum(III)phenolate ($Alq_2$ OPH).

11. The method of claim 5, wherein the cathode comprises a metal substitute, a non-metallic material or a metallic material chosen from Ag, Au, and Al.

12. The method of claim 1, wherein the substrate comprises at least one of a conducting oxide chosen from indium tin oxide (ITO), tin oxide (TO), gallium indium tin oxide (GITO), zinc oxide (ZO), and zinc indium tin oxide (ZITO), and transparent conductive polymers.

13. The method of claim 12, wherein the transparent conductive polymers comprise polyanaline (PANI).

14. The method of claim 5, wherein the bulk heterojunction organic photovoltaic cell comprises ITO/CuPc/$C_{60}$/BCP/Al.

15. The method of claim 4, wherein at least one organic layer is deposited by vacuum thermal evaporation and/or organic vapor phase deposition.

16. The method of claim 15, wherein at least one of the organic layers has a thickness ranging from 25-1200 Å.

17. The method of claim 5, wherein the anode comprises an interfacial layer comprising MoOx.

18. The method of claim 1, comprising depositing a conformal buffer layer on the substrate prior to depositing said at least one organic material.

19. The method of claim 1, further comprising depositing at least one additional material after depositing said at least one organic material, wherein said at least one additional material is deposited with an incident vapor flux having a trajectory that is normal to the substrate.

20. The method of claim 19, wherein said depositing of the additional material and the at least one organic material occurs on a moving substrate.

21. The method of claim 20, wherein said moving substrate is in a reel-to-reel or in-line deposition system.

22. The method of claim 5, wherein the bulk heterojunction organic photovoltaic cell comprises ITO/ClAlPc/$C_{60}$/BCP/Al.

* * * * *